United States Patent
Sekine et al.

(10) Patent No.: US 6,495,914 B1
(45) Date of Patent: Dec. 17, 2002

(54) MULTI-CHIP MODULE STRUCTURE HAVING CONDUCTIVE BLOCKS TO PROVIDE ELECTRICAL CONNECTION BETWEEN CONDUCTORS ON FIRST AND SECOND SIDES OF A CONDUCTIVE BASE SUBSTRATE

(75) Inventors: Kenji Sekine, Hinode (JP); Hiroji Yamada, Shiroyama (JP); Matsuo Yamasaki, Satsuma (JP); Osamu Kagaya, Tokyo (JP); Kiichi Yamashita, Shiroyama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/485,400

(22) PCT Filed: Aug. 19, 1998

(86) PCT No.: PCT/JP98/03668

§ 371 (c)(1),
(2), (4) Date: Feb. 10, 2000

(87) PCT Pub. No.: WO99/09595

PCT Pub. Date: Feb. 25, 1999

(30) Foreign Application Priority Data

Aug. 19, 1997 (JP) .............................................. 9-222229
Sep. 25, 1997 (JP) .............................................. 9-259589
Mar. 19, 1998 (JP) ........................................... 10-069727

(51) Int. Cl.$^7$ ............................................. H01L 23/34
(52) U.S. Cl. ...................... 257/723; 257/706; 257/707; 257/708; 257/711; 257/733
(58) Field of Search ................................ 257/706–708, 257/711, 723, 733

(56) References Cited

U.S. PATENT DOCUMENTS 6,081,028 A * 6/2000 Ettehadieh et al. ........... 257/713
6,159,770 A * 12/2000 Tetaka et al. ................. 438/112
6,184,575 B1 * 2/2001 Chillara et al. ............... 257/692

FOREIGN PATENT DOCUMENTS

| EP | 0577966 A1 | * 6/1993 | ............ H01L/23/31 |
| JP | 55-91844 A | * 7/1980 | ................. 257/708 |
| JP | 61-166050 A | * 7/1986 | ................. 257/708 |
| JP | 3-155144 | 7/1991 | |
| JP | 5-47856 | 2/1993 | |
| JP | 05047856 | * 2/1993 | ............ H01L/21/60 |

* cited by examiner

Primary Examiner—Eddie Lee
Assistant Examiner—Matthew E. Warren
(74) Attorney, Agent, or Firm—Antonelli, Terry, Stout & Kraus, LLP

(57) ABSTRACT

A metal base substrate for mounting a plurality of bare semiconductor chip devices thereon has first and second main surfaces. The first main surface has formed thereon at least one projection, and at least two recesses in which the bare semiconductor chip devices are to be mounted. The depth of these recesses is smaller than the length of said projection, and the recesses have a higher surface smoothness than said main surfaces of said metal substrate. The metal base substrate is partially chemically etched to form the projection, and the first main surface of the substrate is mechanically worked to form at least the recesses. The conductive projection is isolated from the portion on which the bare semiconductor chip devices are mounted, of the base substrate, and the conductive projection acts as a terminal that can be electrically connected to the outside on the first and second main surfaces of the base substrate.

15 Claims, 12 Drawing Sheets

MULTI-CHIP MODULE STRUCTURE HAVING CONDUCTIVE BLOCKS TO PROVIDE ELECTRICAL CONNECTION BETWEEN CONDUCTORS ON FIRST AND SECOND SIDES OF A CONDUCTIVE BASE SUBSTRATE

TECHNICAL FIELD

The present invention relates to a multi-chip module structure having a plurality of bare semiconductor chips and at least one conductive post mounted on a base substrate, and a fabrication method thereof.

As a means for making electronic devices small and of high performance, there is known the so-called multi-chip module in which a plurality of bare semiconductor chips and passive elements are interconnected to form one module.

One example of the conventional methods of mounting a bare semiconductor chip is disclosed in JP-A-3-155144 (laid open Jul. 3, 1991). In this example, a hole larger than the semiconductor IC chip in a predetermined degree is previously formed in an insulating film that is thicker than the bare semiconductor chips in a predetermined degree. This insulating film is stuck to a support plate with an adhesive, and the bare semiconductor IC chip is bonded with an adhesive into the hole in the insulating film. A liquid resin resin of the same material as that of the insulating film is applied to gaps between the insulating film and the bare semiconductor IC chips and to the surface of the bare semiconductor IC chip so that the surface of the insulating film layer has a uniform level over the support plate. This applied resin is heated to cure, and the resin on the pads of the bare semiconductor IC chips is removed by photolithography. Then, a conductive film is deposited over the entire surfaces, and patterned by photolithography to form predetermined conductor wiring patterns.

One example of the conventional semiconductor devices (particularly multi-chip modules) and fabrication methods thereof is disclosed in JP-A-5-47856 (laid open Feb. 26, 1993). In this example, a chip is mounted on at least one stage provided on a package, and an insulating film is coated on the package and the chips. Via-holes are provided in the insulating film in order to connect the connection pads on the package and the pads on the chips. These via holes are connected by a wiring conductor pattern.

In the examples of JP-A-3-155144 and JP-A-547856, the support plate or package is an insulating substrate, and the material of the insulating substrate is generally one order of magnitude or more lower in thermal conductivity than the conductive and semiconductor materials. Thus, these examples are not suited for mounting large-power consumption chips such as power amplifiers.

Moreover, in the example of JP-A-5-47856, the mounting conductive layers (for example, Au-Si eutectic or conductive adhesive) on the rear sides of the chips do not have electrical junctions with the wiring conductors on the insulating film.

Also, in the example of JP-A-3-155144 of the conventional bare semiconductor chip mounting methods, when the same liquid resin as the material of the insulating film is filled in the gaps between the insulating film and the bare semiconductor IC chips and coated on the surfaces of the bare semiconductor IC chips so that the coated liquid resin surface can have a uniform level over the support plate, and when the liquid resin is heated to cure, depressions may be formed, due to the contraction of the resin, in the surfaces of the cured resin filed in the gaps between the insulating film and the bare semiconductor IC chips. The occurrence of depressions in the gaps will sometimes cause short circuits or disconnection in the wiring conductors on the gaps.

Even in the example of JP-A-5-47856 of the semiconductor devices and fabrication methods thereof, when the liquid resin is heated to cure, depressions may be sometimes caused in the insulating film across the gaps between the package and the chips due to the contraction of the resin. The depressions may cause short circuits or disconnection in the wiring conductors across the gaps.

As a means for solving this problem, there is known a chip-buried type multi-chip module. In this method, a plurality of projections or recesses are previously provided on a metal base substrate, and bare semiconductor chips are placed in the recesses and covered with an insulating resin film so that the bare chips can be buried. The insulating film is flattened by grinding or the like so that the insulating film can be made flush with the bump electrodes on the bare semiconductor chips. Then, thin film passive components, metal layers and insulating films are mounted and deposited on the base substrate to form a multilayered structure. In this method, however, desired projections or recesses cannot be easily formed on the base substrate.

In addition, the conventional examples are constructed not to enable a cap to be mounted on each multi-chip module structure. Therefore, the conventional structures cannot be mechanically protected from the damage from the outside, and thus they are easy to be broken. Moreover, when operated in a high-frequency range, they are subject to interference from the outside because their electromagnetic shields become weak.

DISCLOSURE OF THE INVENTION

According to one aspect of the invention, a base substrate for mounting a plurality of bare semiconductor chips (also described throughout the present specification as "chip devices") thereon has first and second main surfaces. The first main surface has formed thereon at least one projection, and at least two recesses in which the bare semiconductor chip devices are to be mounted. The depth of the recesses are smaller than the length of the projection, and the recesses have a higher surface smoothness than the first main surface of the metal substrate.

According to another aspect of the invention, a base substrate made of metal or semiconductor has previously integrally formed on a main surface a plurality of recesses for mounting bare chip devices thereon, and a plurality of post-like projections as part of the base substrate. In addition, grooves are provided to surround the roots of some of the posts, and the bare chip devices including semiconductor elements or IC chips with conductive bumps provided on electrodes are mounted on the recesses. The bare chip devices are covered to bury with an insulating film. The insulating film and the bumps of the bare chip devices are flattened to have the same level. A wiring conductor pattern of a metal layer and an insulating film is formed thereon. The base substrate is etched or ground from the rear side to be thinned so that island-like conductors appear isolated by the insulating film, thus electrodes electrically isolated from a reference potential conductor being formed on the rear side of the base substrate.

In addition, the base substrate is previously worked on the rear main surface opposite to the main surface on which the bare chip devices are to be mounted, to form in that rear main surface a plurality of recesses which are deeper than the portion to be etched away or ground down when the base substrate is etched or ground from the rear main surface to be thinned, so that when the base substrate is cut into unit module sizes after the thinning process, the substrate of each unit module with the bare chip devices mounted on the first main surface can have recesses on its sides, and a metal cap of opposite recess is fitted in the recesses on the sides of the module to cover the unit module.

According to another aspect of the invention, a structure for mounting a plurality of bare semiconductor chip devices thereon can be produced by chemically partially etching a metal substrate having first and second main surfaces in order that at least one recess can be formed in the first main surface, and by mechanically working the first main surface of the metal substrate in order that at least two recesses for mounting the bare semiconductor chip devices thereon can be formed in an area with no projection provided, of the etched first main surface of the metal substrate. The recesses formed by the mechanical working step are smaller in depth than the length of the projection formed by the chemical etching step, and have a higher surface smoothness than the etched main surface of the metal substrate.

According to another aspect of the invention, a base substrate is produced by a two-step working process of etching and press working. Projected conductive posts and walls for surrounding the individual modules are integrally formed as part of the base substrate by the first stage etching process.

Then, after the aperture markers previously provided in the base substrate are aligned with the markers of molds, the base substrate is fitted and pressed between the molds by the second stage press working to form alignment markers at which bare semiconductor chip devices are to be mounted. In this case, the alignment markers are recesses, and the side walls of the recesses have substantially a taper of 15 to 60 degrees provided. Particularly, this taper helps the devices be slipped down into the markers, thus easily self-aligned with when the chip devices are mounted.

That is, in the two-stage working process, the metal base substrate can be deeply etched by the first stage etching process so that the recesses in which a plurality of bare semiconductor chip devices are to be buried and the projected connection posts can be produced at a time. In addition, by the second stage press working the etched, rough metal surface can be flattened, and multi-stepped recesses with a taper can be easily formed when the substrate is pressed between molds with projections.

After the base substrate is subjected to the above two-stage working process, bare semiconductor chip devices with metal bumps are bonded onto the chip-device mounting markers. Then, the bare chip devices are covered to be buried with a resin insulating film, and the insulating film is ground or polished until the insulating film and the bumps of bare chip devices have the same level. Moreover, a wiring conductor pattern is formed thereon to complete a thin, small-sized multi-chip module structure.

BEST MODE FOR CARRYING OUT THE INVENTION

Figure 1A:
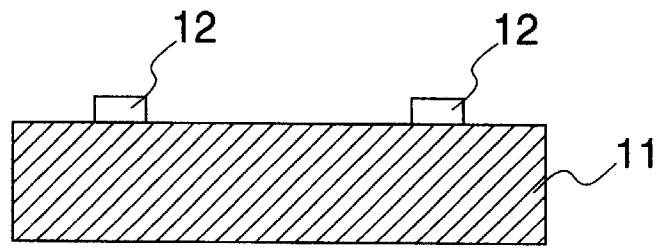
FIGS. 1a to 1e are cross-sectional views to which reference is made in explaining the production processes for a base substrate according to one embodiment of the invention.
Figure 1B:
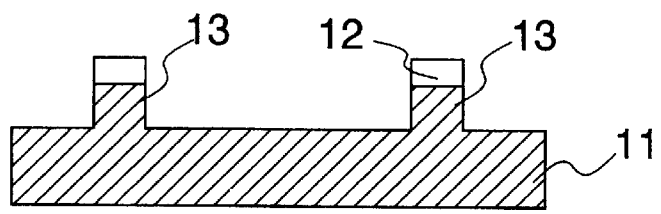
Figure 1C:
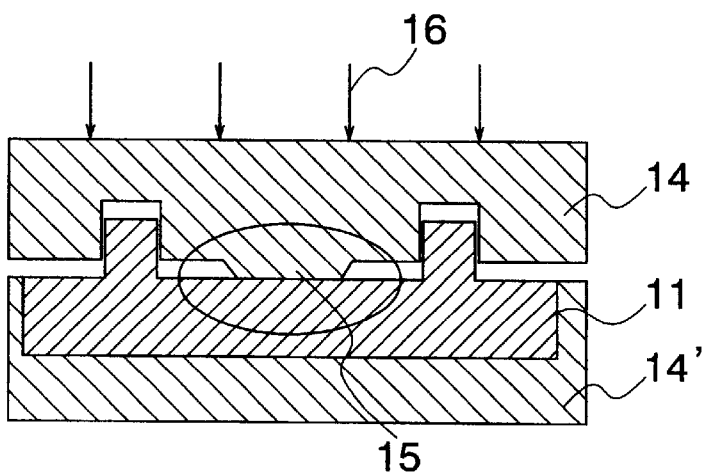
Figure 1D:
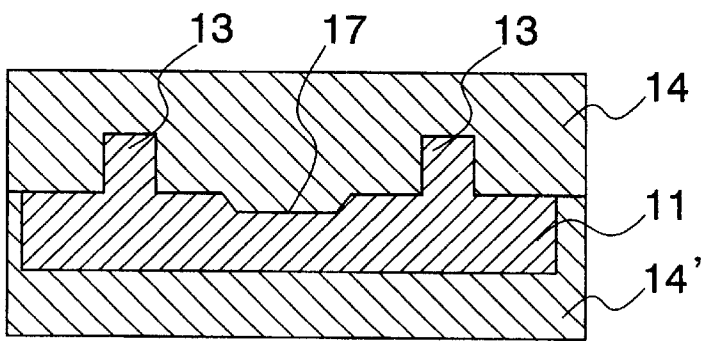

FIGS. 1a to 1e show the production processes for a base substrate according to one embodiment of the invention. As the first stage, a resist mask 12 for etching is formed as shown in FIG. 1a by photolithography on a first main surface of a metal base substrate 11 made of, for example, copper, Cu. Then, as illustrated in FIG. 1b, the metal base substrate 11 is etched to a depth of 180 $\mu$m with a chemical etchant of ferric chloride to form a projected connection post or projection 13. As shown in FIG. 1c, the press working is performed as the second stage. The metal base substrate 11 with the connection post 13 formed is fitted between metal molds 14, 14', and then started to be gradually pressed by applying a weighting 16 (a metal mold projection 15 with a taper is shown as indicated by a circle). As shown in FIG. 1d, the press working on the metal substrate is completed by final weighting. The depth of a resulting recess 17 is generally smaller than the length of the projection 13.

Figure 1E:
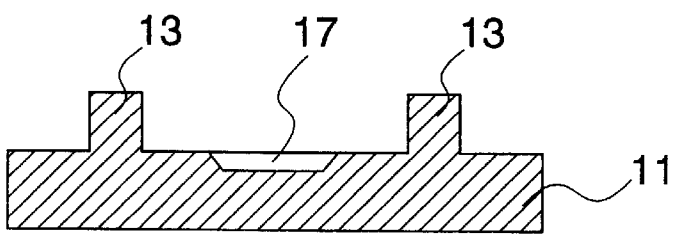

The base substrate 11 removed from the metal molds as shown in FIG. 1e has the recessed marker or recess 17 of 20-$\mu$m depth and of a taper angle of 15~60 degrees, here 45 degrees formed at a position where a semiconductor chip device is placed and bonded, thus completing the base substrate production according to the second stage working. The area of the recess 17 is decreased, or tapered toward the bottom.

The feature of the two-stage working is that the base substrate surface is engraved deeply by the first stage etching process to form the projection inside which a bare semiconductor chip device is to be buried, and that in the second stage press working the base substrate with the projection is fitted between the metal molds with a tapered projection and pressed by applying a low weighting so that the irregular metal surface roughed by etching can be flattened and to form the recessed marker or recess of which the smoothness is higher than the etched surface. The material of the base substrate 11 may be aluminum, Al.

FIGS. 2a to 2d show the production processes for a base substrate that is used for a single module structure including a plurality of bare semiconductor chip devices, according to another embodiment of the invention.

Figure 2A:
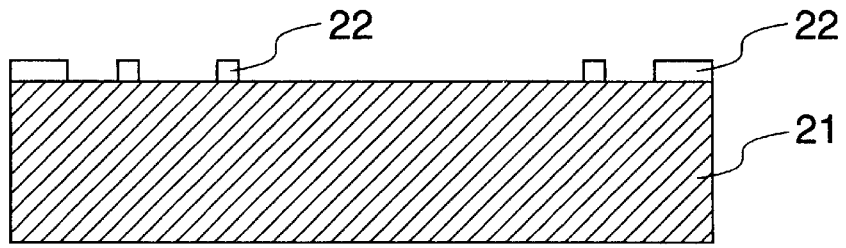
FIGS. 2a to 2d are cross-sectional views to which reference is made in explaining the production processes for a base substrate according to another embodiment of the invention.
Figure 2B:
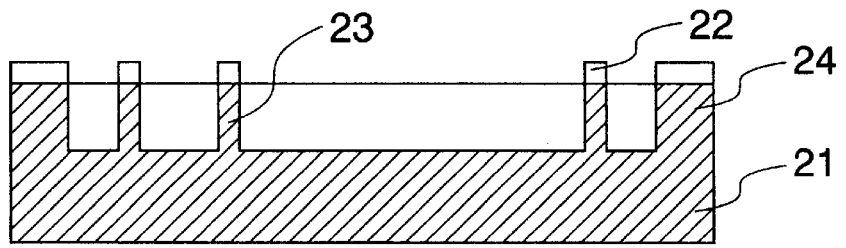

A metal base substrate 21 is made of copper, Cu. The size of the modules to be built on the substrate is 10 mm square. First as the first stage, a resist film 22 for etching as shown in FIG. 2a is formed by photolithography on the base substrate 21. The base substrate is to be etched through the mask of the resist film to form connection posts of a diameter of 200 $\mu$m and of a substantially columnar shape and curb-like walls of 600-$\mu$m width for separation between module structures. As shown in FIG. 2b, the metal base substrate 21 is etched through the mask to a depth of about 180 $\mu$m with a chemical etchant of a ferric chloride based material to form connection posts or projection 23 and surrounding walls 24 for separation between module structures. The surrounding walls 24 are each a conductive block provided on the outermost side of the base substrate of each module and serve to electromagnetically shield and mechanically reinforce the module structure.

Figure 2C:
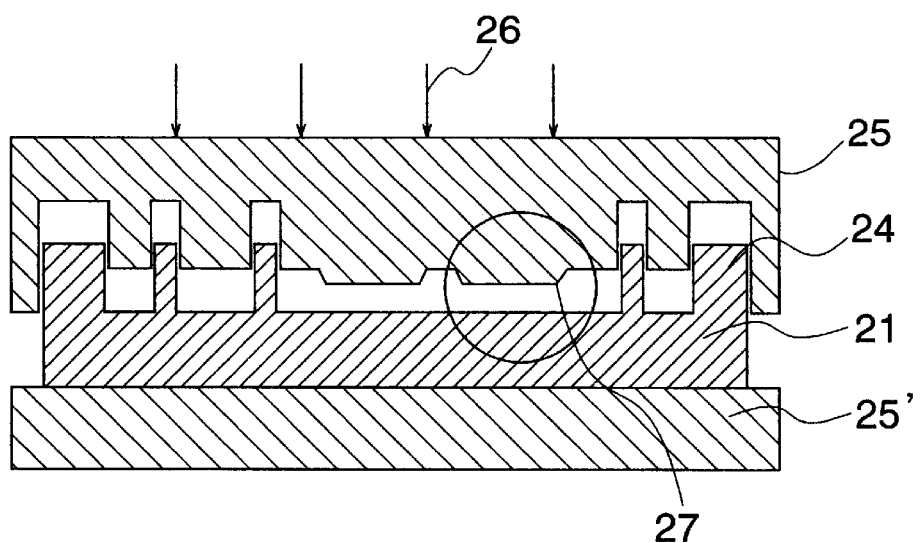
Figure 2D:
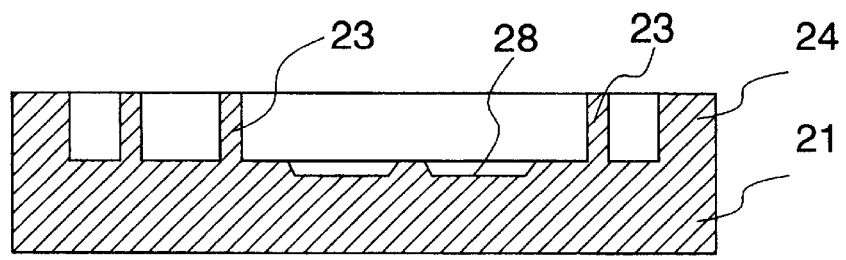

Then, the second stage press working is performed as shown in FIG. 2c. After the base substrate and metal molds 25, 25' are aligned and fitted at pilot markers formed on the base substrate and at markers on the mold 25, the base substrate 21 is started to be gradually pressed between the molds 25, 25' by applying a weighting 26 (one of metal mold projections 27 with a taper is shown as indicated by a circle). In this case, it is necessary that the metal molds be designed to be slightly larger than the connection posts 23 and the surrounding walls 24 in order that the connection posts 23 and surrounding walls 24 can be prevented from being deformed at the time of pressing. As shown in FIG. 2d, recessed markers or recesses 28 in which bare semiconductor chip devices are to be mounted are formed on the etched surface of the base substrate 21 after the press working. In this two-stage working, the connection posts 23 and surrounding curb-like walls 24 for separation between module structures are produced by etching, and the recess markers 28 in which bare semiconductor chip devices are to be mounted are formed on the base substrate by press working.

Figure 3A:
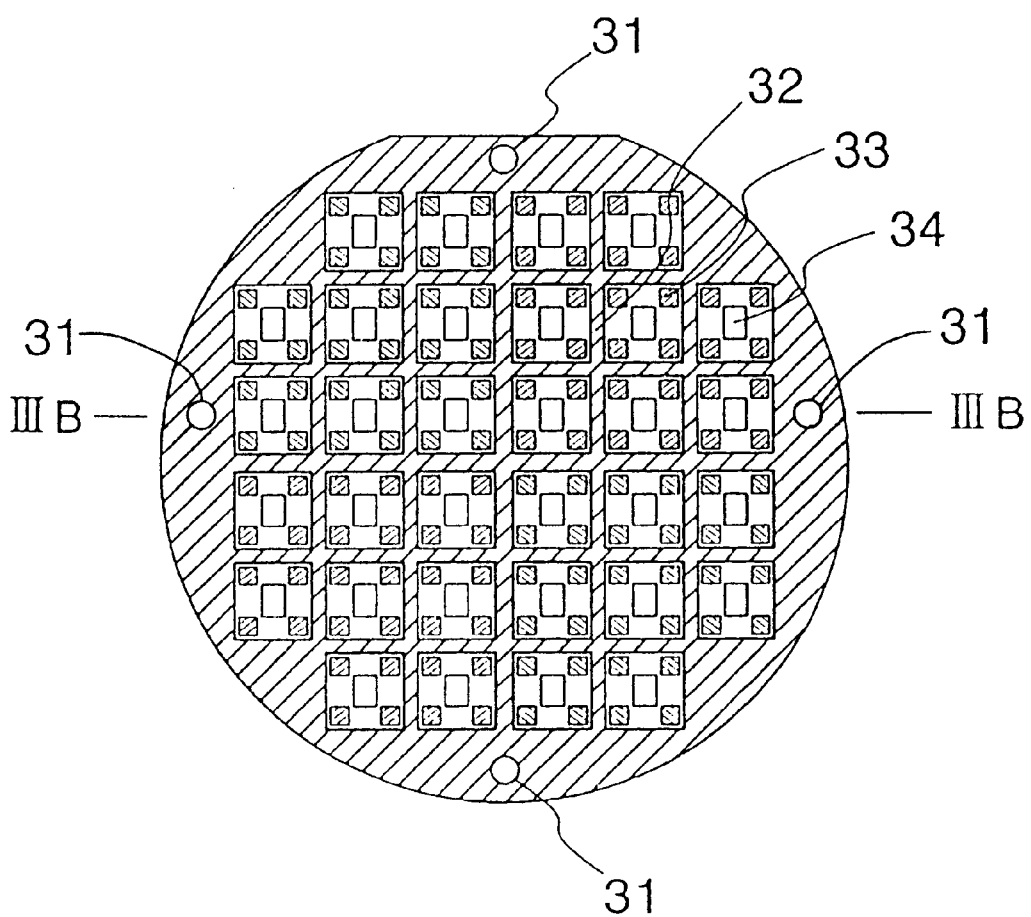
FIGS. 3a and 3b are plan and cross-sectional views showing pilot markers and layout of surrounding walls in a substrate according to another embodiment of the invention.
Figure 3B:
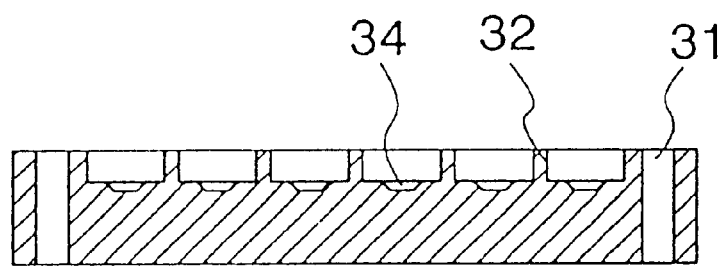

FIGS. 3a and 3b show a layout of pilot markers and curb-like walls for separation between modules provided on the base substrate according to another embodiment of the invention.

FIG. 3a is a plan view of the base substrate of 75 mm$\phi$ in diameter, 700 $\mu$m in thickness and made of a copper, Cu plate which has built thereon a plurality of module structures of 10 mm square each. Apertures of 3 mm$\phi$ in diameter are provided in the substrate as the pilot markers 31 along the substrate periphery at four positions in order to use for the alignment with the metal mold markers before the press working. In addition, the curb-like walls 32 are provided between the module structures in order to prevent the base substrate from being curved in the burying process in which the insulating film is filled over the substrate surface to cover bare chip devices after the bare chip devices are mounted, and in order to serve as shielding side walls when the substrate is cut into individual module structures. Reference numeral 33 represents the posts or projections formed in each module structure.

FIG. 3b is a cross-sectional view taken along a line IIIB—IIIB in FIG. 3a. The markers 34, in which bare chip devices are mounted, and which are produced by the press working, each have a taper of 45 degrees provided on the sides.

FIGS. 4a to 4d show production processes for a multi-chip module structure according to another embodiment of the invention.

Figure 4A:
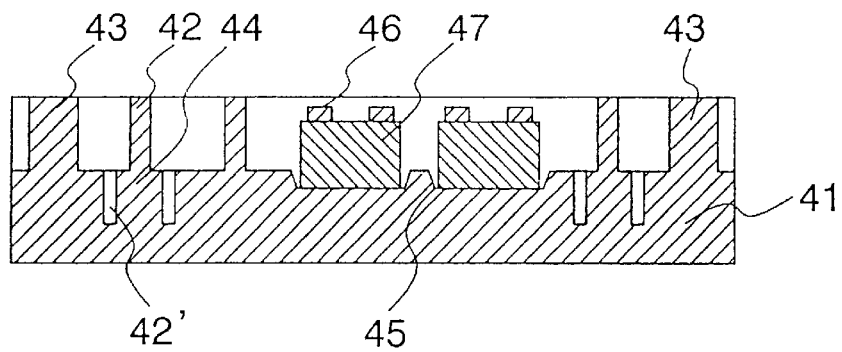
FIGS. 4a to 4d are cross-sectional views showing the production processes for a multi-chip module structure according to another embodiment of the invention.
Figure 4B:
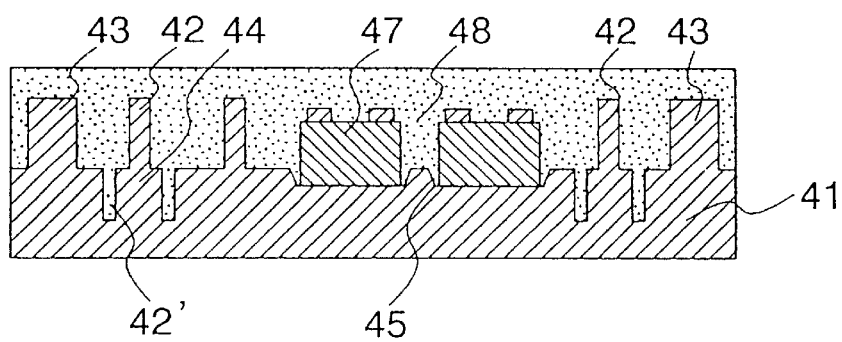
Figure 4C:
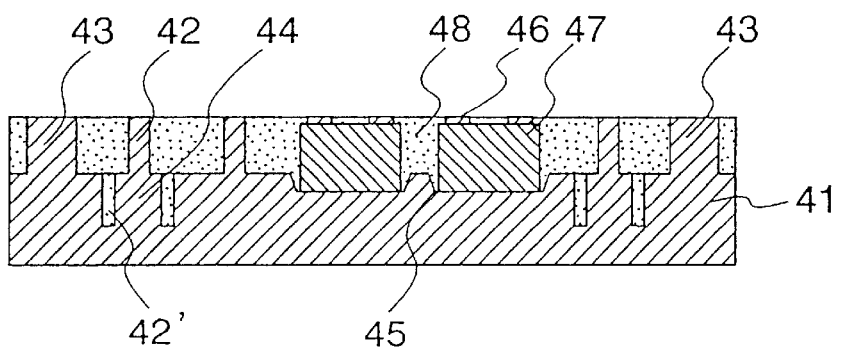
Figure 4D:
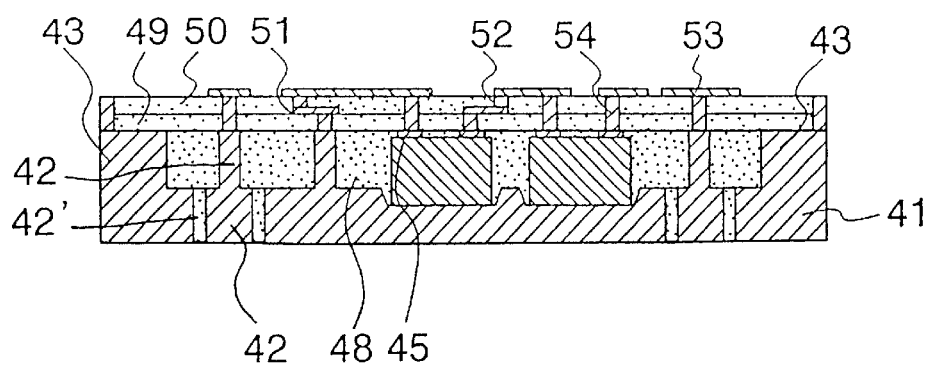

First as shown in FIG. 4a, bare chip devices 47 each including a plurality of semiconductor devices or IC chips with metal (for example, gold Au or aluminum Al) bumps 46 provided on the electrodes are placed and bonded with Au-Sn eutectic solder on a base substrate 41 that has connection posts (projections) 42 (also including grooves 42' that surround the connection posts), a surrounding wall (projection) 43 for separation between module structures, electrodes 44 and markers (recesses) 45 for mounting bare chip devices, previously provided on its first main surface by the etching and press working. The markers 45 are formed by the press working as in the above embodiment mentioned above and each have a taper. The projections 42, 43 are formed by the etching, and the markers 45 and grooves are formed by the press working. Then, as shown in FIG. 4b, epoxy resin 48 for a first insulating film is filled in the recesses on the base substrate 41 and coated over the projections and bare chip devices 47 on the substrate so as to bury those projections and chip devices. AS shown in FIG. 4c, the epoxy resin 48 after being heated to cure is flattened in its surface by grinding or polishing so that the connection posts 42, the surrounding walls 43 and the metal bumps 46 on the bare chip devices 47 can be exposed. In addition, as shown in FIG. 4d, on the flattened insulating film 48 there are sequentially formed a second insulating film 49 on which thin film passive components and wiring conductor patterns for a multilayer are to be successively produced, a third insulating film 50, a first wiring conductor pattern 51 of a metal layer, a capacitor 52 produced on the first wiring conductor pattern, a second wiring conductor pattern 53 of a metal layer and conductive through-holes 54 that penetrate the second and third insulating films 49, 50. Thereafter, the rear side of the multi-chip module structure is ground by grinding or etching until the insulating film 48 is exposed so that the surrounding walls 43 and electrodes 44 can be separated from the base substrate 41 to form conductive blocks.

Moreover, the base substrate with the module structures is cut along the centers between the adjacent surrounding walls 43 of the module structures into individual multi-chip module structures.

The conductive posts 42 are supported by the burying resin 48 filled in the grooves 42' and between the connection post 42 and the bare chip device 47, and are isolated from the base substrate 41. Therefore, since the electrodes can be directly drawn out of the rear side of the substrate, the multi-chip module structure can be soldered directly to a mother board. Thus, the mounting area can be reduced as compared with the case in which the module structure is electrically connected thereto by leads.

Figure 5A:
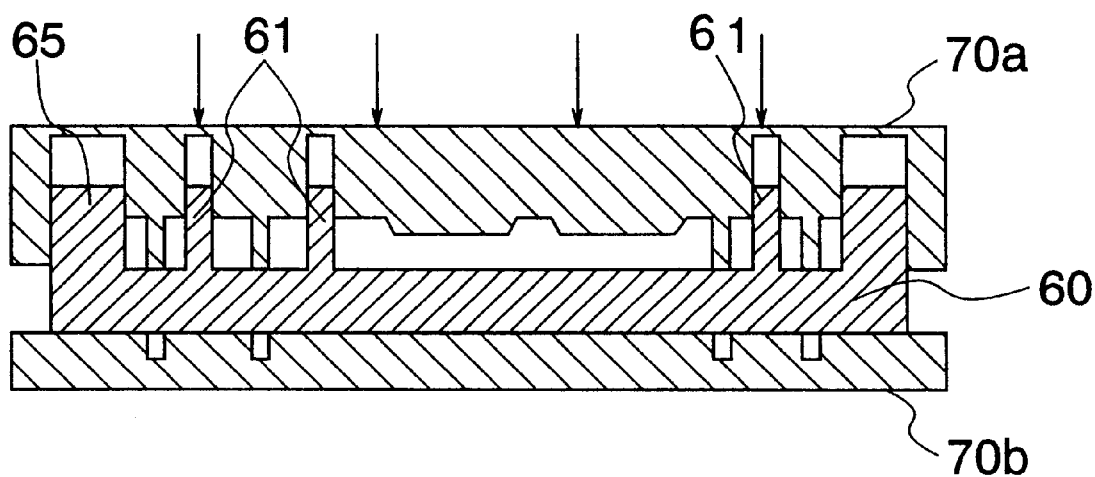
FIGS. 5a and 5b are cross-sectional views showing the production processes for a base substrate according to another embodiment of the invention.
Figure 5B:
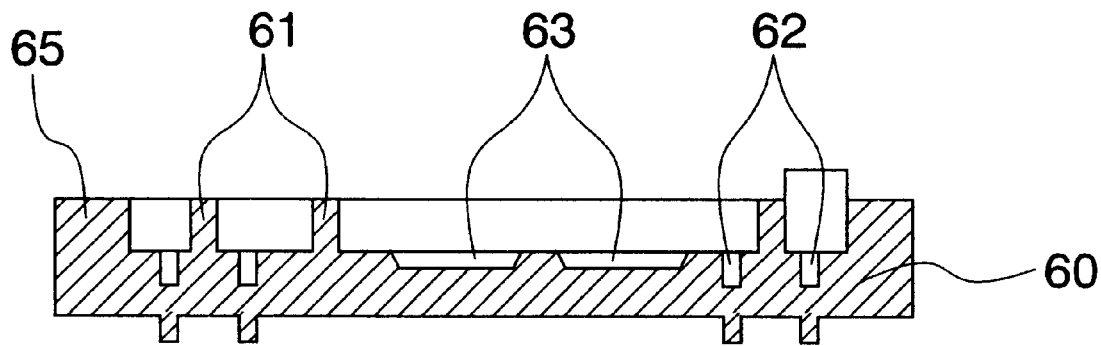

FIGS. 5a and 5b show a method of fabricating a base substrate according to another embodiment of the invention. In this embodiment, the substrate with the conductive posts and walls formed by etching is fitted and pressed between a set of an upper metal mold with projections and a lower metal mold with recesses opposite to the projections.

As illustrated in FIG. 5a, a substrate 60 with conductive posts 61 and surrounding walls 65 formed by etching is fitted and pressed between an upper metal mold 70a and a lower metal mold 70b by press working as means for plastic deformation so as to form resin filling grooves 62 around the conductive posts 61 and recessed markers 63 for chip mounting.

In this embodiment, since the recesses of the lower metal mold 70*b* oppose the projections of the upper metal mold 70*a*, the portions of the substrate pushed by the projections of the upper metal mold 70*a* can be escaped to the recesses of the lower metal mold 70*b*. Therefore, the substrate after press working can be easily prevented from being deformed such as curved as compared with the use of a flat lower metal mold.

The projections formed on the rear side of the substrate after the press working as shown in FIG. 5*b* can be removed by grinding the rear side of the substrate until the conductive posts are exposed. At this time, some grooves around the conductive posts 61 serve to make the walls 65 the independent conductive blocks.

According to the above embodiments using the two-stage processes of etching and press working, the recesses and projections of a certain depth can be reproducibly produced at predetermined positions on the base substrate. In addition, these successive etching and press working techniques enable the production processes to be simplified and the processing time to be shortened.

In addition, the surrounding walls produced by etching can suppress the base substrate from being curved when the insulating film is filled, thus stabilizing the processes.

Moreover, the press working can flatten the metal surface roughed by etching, thus expanding the margin of bonding conditions at the time of bare chip mounting. In other words, good adhesion with no bubble can be attained in the interface between the chip and the substrate. In addition, since the adhesion is improved, the heat generated from the chip can be escaped with ease.

Also, a leadless structure can be attained when the electrodes are drawn out of the rear side of the module.

Figure 6:
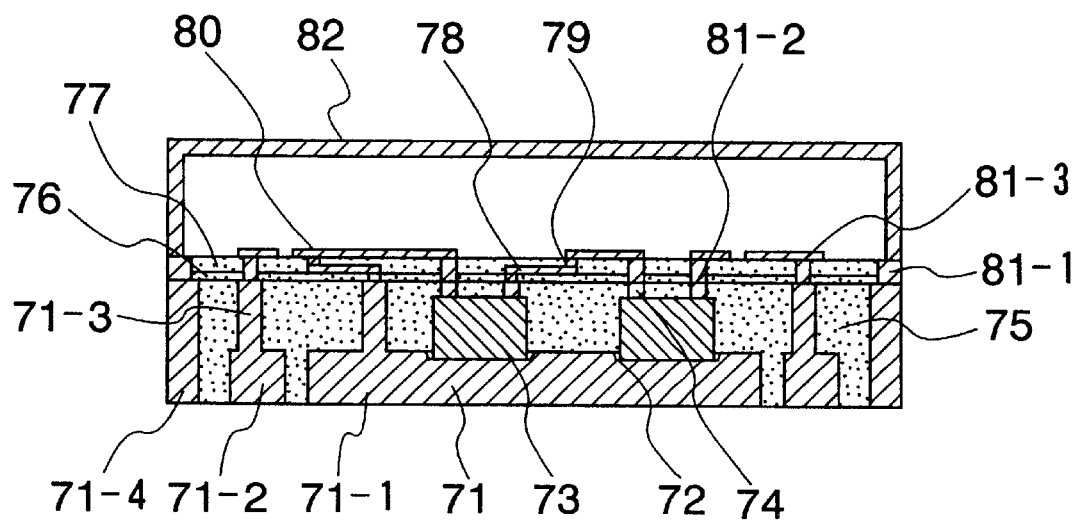
FIG. 6 is a cross-sectional view of a multi-chip module structure according to another embodiment of the invention.

FIG. 6 is a cross-sectional view of a multi-chip module structure according to another embodiment of the invention. Referring to FIG. 6, there are shown abase substrate 71 that is made of a conductive material such as metal or semiconductor, and that includes portions 71-1, 71-2, 71-3, 71-4, tapered recesses 72 for mounting bare chip devices, bare chip devices 73 that each include a plurality of semiconductor elements or IC chips having metal (for example, Au or Al) bumps (connection conductors) 4 on electrodes, and a first insulating film 75 of, for example, resin filled to cover the bare chip devices 73 and the posts 71-3 of the base substrate. In addition, there are shown insulating films and conductive layers formed on the first insulating film, that is, second and third insulating films 76, 77, a first wiring conductor pattern 78 of metal layer, a capacitor 79 formed on the first wiring conductor pattern, a second wiring conductor pattern 80 of metal layer, conductive through-holes 81-1, 81-2, 81-3 that penetrate the second and third insulating films, and a metal cap 82 that covers the whole base substrate 71. This multi-chip module structure enables the electrodes (conductive blocks) for the signal input/output terminals and power supply terminals to be substantially provided together on the rear side of the base substrate, thus easily electrically connected to the outside. The posts 71-3 of the base substrate 71 are connected to the wiring conductor pattern 80 of metal layer. The cap may be made of resin, and in this case it serves to mechanically reinforce the structure. The cap also may a resin material plated with metal. At this time, the cap serves to shield the structure as the metal cap and mechanically reinforce the structure.

Figure 7:
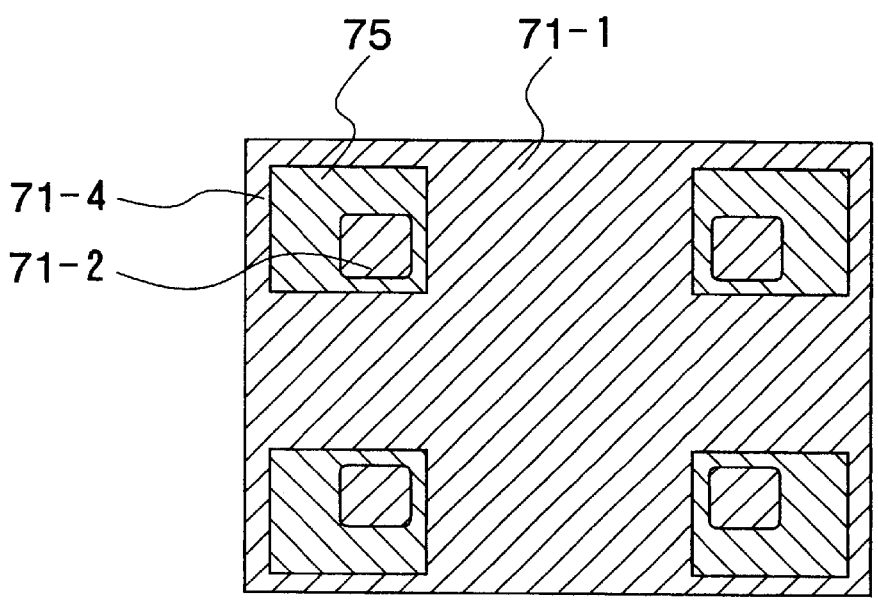
FIG. 7 is a plan view showing the rear side of the structure shown in FIG. 6.

FIG. 7 is a rear side view of the structure of FIG. 6. As illustrated in FIG. 7, the reference potential portion 71-1 and electrode portion 71-2 of the base substrate 71 are electrically insulated by the first insulating film 75. In addition, the conductive wall 71-4 for electromagnetic shielding is provided on the sides.

Figure 8A:
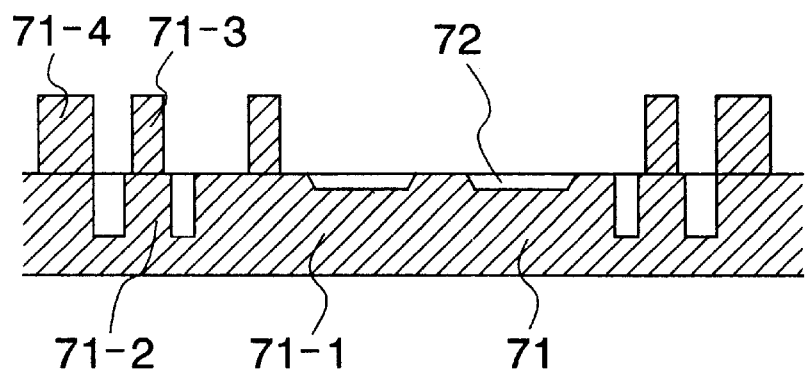
FIGS. 8a to 8g are diagrams showing the production processes for a multi-chip module structure according to another embodiment of the invention.

FIGS. 8*a* to 8*g* show production processes for a multi-chip module structure according to another embodiment of the invention. FIG. 8*a* is a cross-sectional view of the base substrate 71 with the rear side not etched or ground. On the first main surface of the base substrate are formed the flat portions 71-1, electrode portions 71-2, posts (projections) 71-3, shielding walls (projections) 71-4 and tapered recesses 72 for mounting bare chip devices by etching and mechanical working. The etching and mechanical working may be the etching and press working used in the above embodiments. However, when the base ago substrate is made of a semiconductor (for example, silicon, Si), other process than the press working, for example, milling or grinding is used as a mechanical working.

Figure 8B:
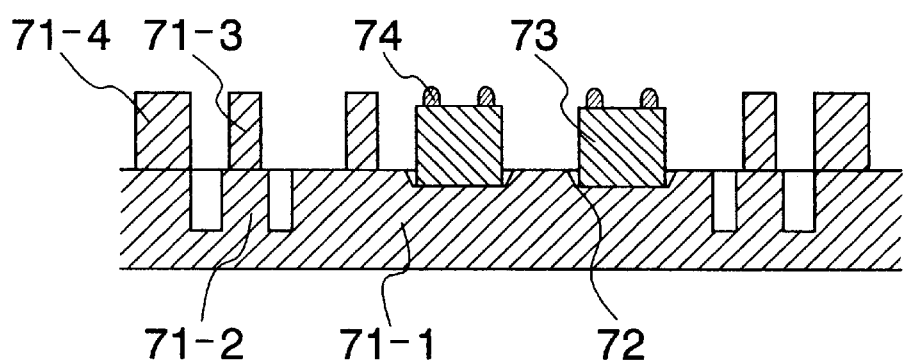
Figure 8C:
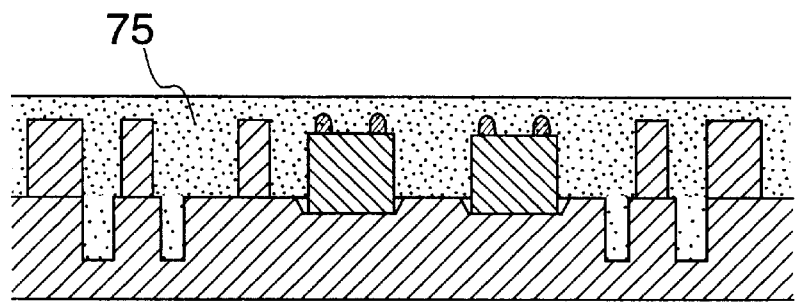
Figure 8D:
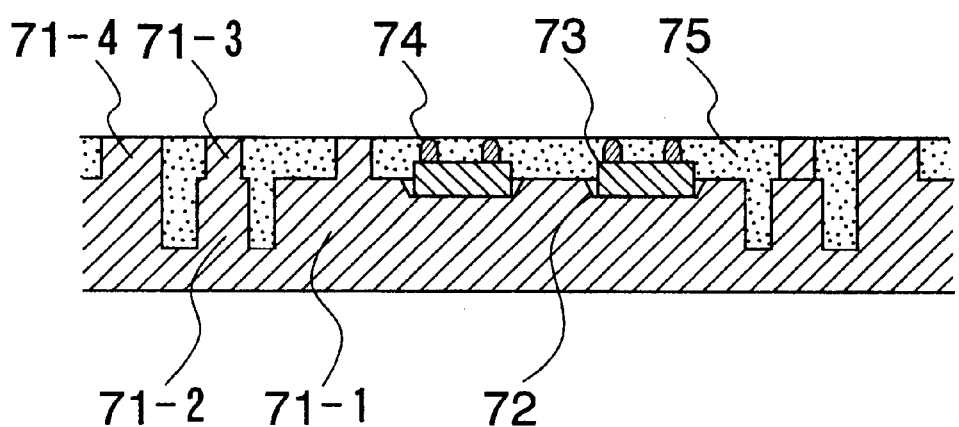

As illustrated in FIG. 8*b*, bare chip devices 73 including a plurality of semiconductor elements or IC chips with metal (for example, Au or Al) bumps 74 on the electrodes are mounted on the base substrate shown in FIG. 8*a*. As illustrated in FIG. 8*c*, the insulating resin 75 is applied to fill in the recesses of the base substrate and cover the projections and the bare chip devices on the substrate shown in FIG. 8*b*. As illustrated in FIG. 8*d*, the insulating resin 75 applied to the recesses, projections and bare chip devices of the base shown in FIG. 8*c* is fattened in its surface by grinding or polishing. Also as illustrated in FIG. 8*e*, on the flattened resin are formed multiple layers, that is, the second and third insulating films 76, 77, first wiring conductor pattern 78 of metal layer, capacitor 79 on the first wiring conductor pattern, second wiring conductor pattern 80 of metal layer thereon, and conductive through-holes 81 that penetrate the second and third insulating films.

Figure 8E:
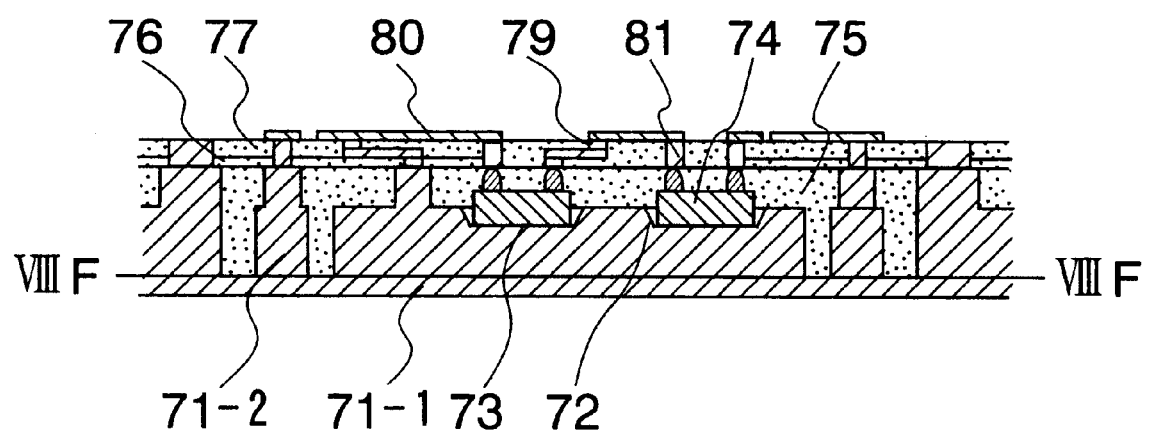
Figure 8:
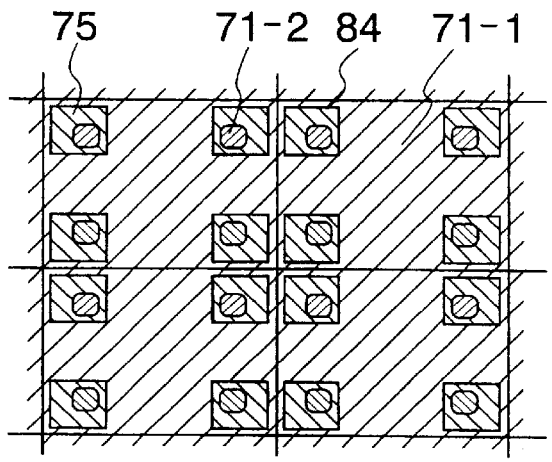
Figure 8:
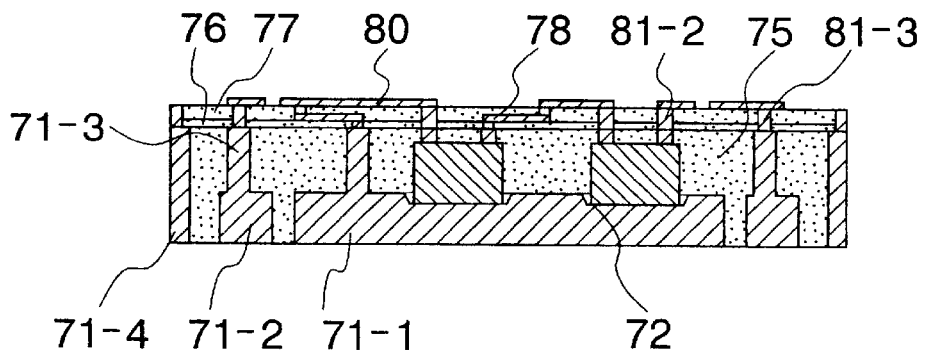

FIG. 8*f* is a rear side view of the multi-chip module structure shown in FIG. 8*e* after the rear side (the second main surface of the base substrate) is ground until the cross-section taken along a line VIII—VIII appares by etching or grinding. The signal input/output terminals and power supply terminals (conductive block) 71-2 are insulated from the base electrodes 71-1 as earth (common potential)conductors by the insulating resin 75. FIG. 8*g* shows a single one of the multi-chip modules into which the multi-chip module structure shown in FIG. 8*e* after being ground from the rear side to the cross-section taken along the line VIII—VIII by etching or grinding is cut along the centers between the adjacent shielding walls (conductive blocks) 71-4.

Figure 9:
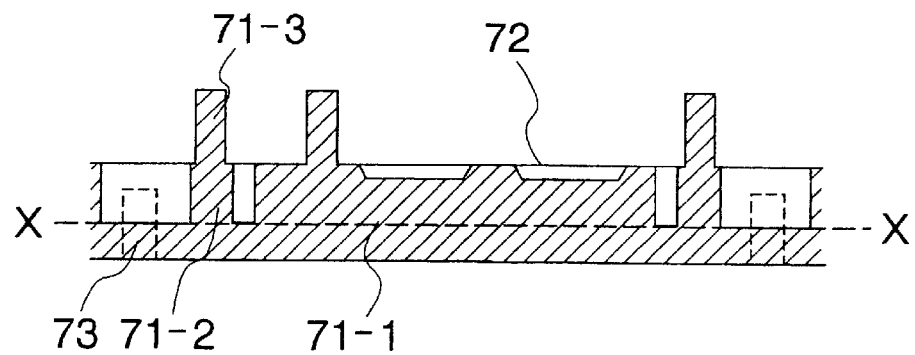
FIG. 9 is a cross-sectional view showing the production processes for a multi-chip module structure according to another embodiment of the invention.

FIG. 9 is a diagram of another embodiment of the invention. The flat portions 71-1, electrode portions 71-2, posts 71-3 and recesses 72 for mounting bare chips are provided together on the base substrate by the etching and mechanical working as in the above embodiments.

Figure 10:
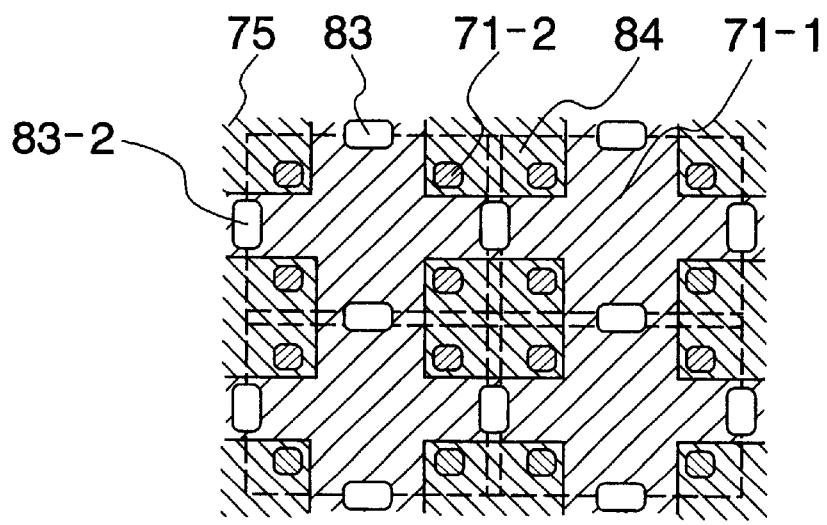
FIG. 10 is a plan view showing the rear side of the structure shown in FIG. 9.

FIG. 10 is a rear side view of the multi-chip module structure shown in FIG. 9 after being ground until the cross-section taken along a line IX—IX appares by etching or grinding. The signal input/output terminals and power supply terminals 71-2 are insulated from the base electrodes 71-1 as the earth (common potential) conductors by the insulating resin 75. In addition, recesses 83 deeper than the cut tab that is cut off when the substrate is thinned by the etching or polishing are provided on the sides of each unit of the modules into which the substrate is cut.

Figure 11:
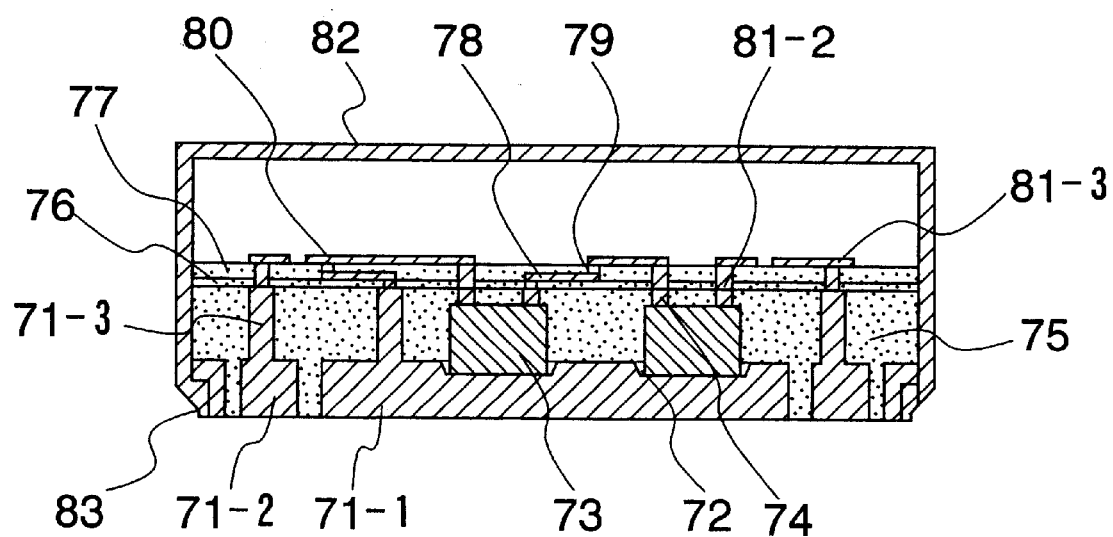
FIG. 11 is across-sectional view of a multi-chip module structure according to another embodiment of the invention.
Figure 12:
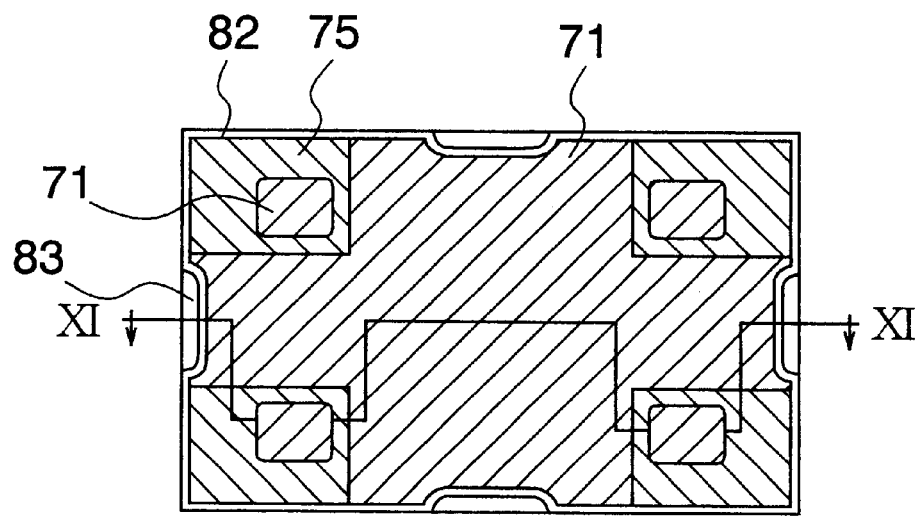
FIG. 12 is a plan view showing the rear side of the structure shown in FIG. 11.

FIG. 11 is a cross-sectional view of a unit module of a multi-chip module structure according to another embodiment. The substrate is cut into individual modules. The unit module has cap fixing recesses 83 provided on its sides or edges of the rear side of the base substrate 71 opposite to the side on which the bare chip devices are mounted. The recesses are deeper than the cut tab that is cut off when the substrate is thinned by the etching or polishing. After the substrate is thinned by the etching or polishing up to a level, and cut into unit modules, the metal cap 82 with opposite recesses to the cap fixing recesses 83 are fitted in the recesses 83. Since the metal cap 82 acts to shield and mechanically reinforce the structure, it is not necessary to provide the shielding walls 71-4. FIG. 12 is a rear side view of the multi-chip module shown in FIG. 11. FIG. 11 is a cross-sectional view taken along a line IX—IX in FIG. 12.

Figure 13:
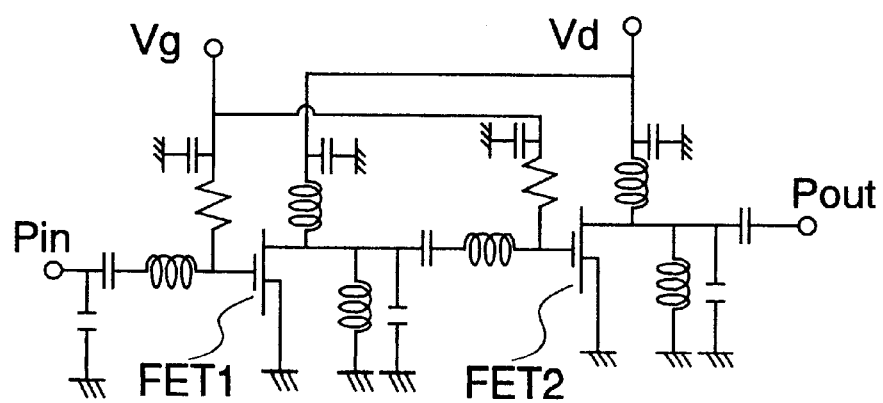
FIG. 13 is a circuit diagram of one example of the circuits included in the multi-chip module structure.
Figure 14:
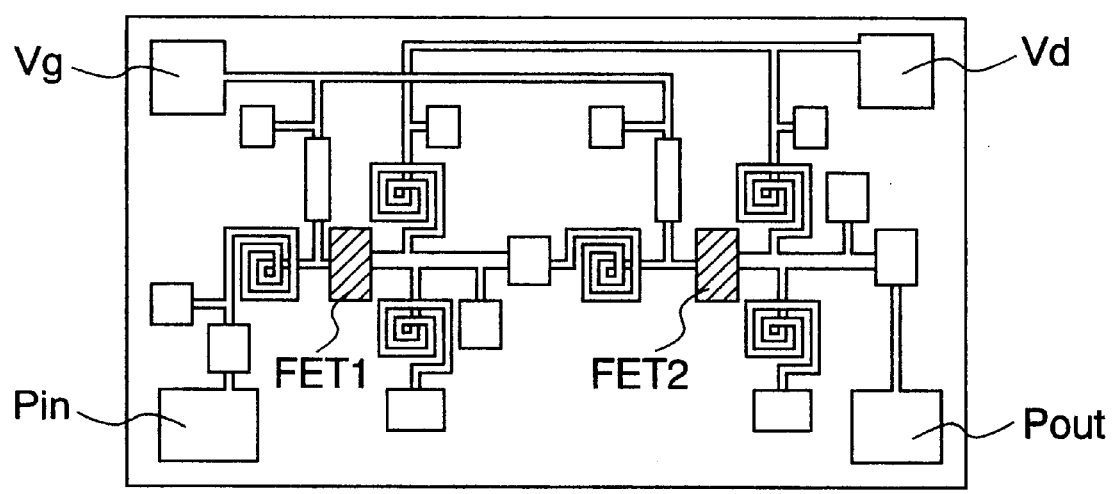
FIG. 14 is a diagram showing one example of the pattern depicted on the top of the multi-chip module structure according to one embodiment of the invention.

FIG. 13 is a diagram of an example of the circuits included in the multi-chip module structure according to an embodiment of the invention. Two-stage high-frequency amplifiers using two FETs are shown as a semiconductor device. FIG. 14 is a diagram showing the pattern of the high-frequency amplifiers shown in FIG. 13. The signal input/output terminal Pin, Pout, gate bias terminal Vg and drain bias terminal Vd are connected to the electrode terminals on the rear side through the via-holes and conductive posts. In this embodiment, the FET1 and FET2 are incorporated in the individual bare chip devices, respectively. The other circuit elements and connection conductors are incorporated in the multilayer wiring pattern.

According to the above embodiments, a plurality of bare chip devices with metal bumps on the electrodes are mounted on the base substrate, and covered or enclosed with the first resin insulating film. The bumps and the insulating film are flattened to have the same height, and the multilayer wiring pattern is formed thereon to built a multi-chip module structure. On one side of the base substrate are integrally provided a plurality of recesses for mounting the bare chip devices, and a plurality of projections or posts as part of the base substrate. Also, such grooves as to cause the posts to rise like islands are provided around some of the posts together with the above recesses and projections. Thus, the multi-chip module structure can be produced with ease, and the electrodes for the signal input/output terminals and power supply terminals can be provided on the rear side of the base substrate. Accordingly, the lead wires necessary for the multi-chip module structure to be mounted on a mother board or the like can be shorted as much as possible, thus greatly improving the high-frequency characteristics.

Moreover, when the multi-chip module structure is cut into individual unit modules, each unit module has a shielding wall on all sides of the module. Thus, it can be mechanically protected from the damage from the outside, and electromagnetically shielded from the external interference when it is operated at high frequencies.

INDUSTRIAL APPLICABILITY

As described above, the multi-chip module structure with a plurality of bare semiconductor chip devices mounted has its heat sink property and high-frequency characteristics improved by employing the conductive base substrate, and the conductive projections and device positioning recesses integrally provided on/in the substrate. In addition, the structure can be protected from the external interference. Moreover, since the conductive projections and device positioning recesses are formed by chemical etching and mechanical working, respectively, those projections and recesses can be reproducibly produced. Therefore, the present invention is useful for making the electronic devices small-sized and have high performances.

What is claimed is:

1. A multi-chip module structure comprising:
a conductive base substrate having first and second main surfaces, said first main surface having provided thereon at least two recesses for bare semiconductor chips to be mounted thereon;
at least a plurality of said bare semiconductor chips mounted on said recesses of said first main surface;
at least one conductive block arranged to provide an electrical connection between a first conductor on a first side on which said first main surface of the conductive base substrate exists and a second conductor on a second side on which said second main surface of the substrate exists;
an insulating material filled in a space between said conductive block, said base substrate, and said bare semiconductor chips to insulate said conductive block from said base substrate and from said bare semiconductor chips; and
an electric connection conductor provided on said insulating material, said electric connection conductor including said first conductor.

2. A multi-chip module structure according to claim 1, wherein a plurality of said conductive blocks are arranged to provide the electrical connection between the first conductor and the second conductor, and an outermost conductive block relative to said base substrate can be used to shield said structure.

3. A multi-chip module structure according to claim 1, further comprising a cap that covers said base substrate, said conductive blocks, said insulating material and said electric connection conductor.

4. A multi-chip module structure according to claim 3, wherein said cap is made of resin and acts to mechanically reinforce said structure.

5. A multi-chip module structure according to claim 3, wherein said cap is made of metal and acts to shield said structure in cooperation with said outermost conductive block and mechanically reinforce said structure.

6. A multi-chip module structure according to claim 3, wherein said cap is made of resin plated with metal, and acts to shield said structure in cooperation with said outermost conductive block and mechanically reinforce said structure.

7. A multi-chip module structure according to claim 1, wherein said conductive base substrate and said conductive block are made of metal or a semiconductor material.

8. A multi-chip module structure according to claim 1, wherein said recesses have a taper at which the area decreases toward the bottom of said recesses.

9. A multi-chip module structure according to claim 8, wherein the angle of said taper is substantially in the range from 15 to 60 degrees.

10. A multi-chip module structure according to claim 1, wherein a projection is provided on part of said base substrate to surround said multi-chip module structure, and a metal recessed cap is provided over said projection.

11. A multi-chip module structure according to claim 1, wherein a recess is provided on part of the sides of said multi-chip structure, and a metal cap is provided to fit in said recess serving as a stopper and thereby to cover said multi-chip module structure.

12. A multi-chip module structure according to claim 1, wherein said bare semiconductor chips include bump electrodes, in electrical contact with said electric connection conductor by way of via holes through an insulating material overlying said bare semiconductor chips.

13. A multi-chip module structure according to claim 1, further comprising an insulating material overlying said bare semiconductor chips, and wherein said electric connection conductor includes conductor portions overlying said bare semiconductor chips.

14. A multi-chip module structure according to claim 13, wherein said electric connection conductor extends in a plurality of levels over the bare semiconductor chips, the plurality of levels being separated vertically in a direction above the bare semiconductor chips by said insulating material overlying said bare semiconductor chips.

15. A multi-chip module structure according to claim 13, wherein said electric connection conductor includes a conductive portion in contact with an electrode on said bare semiconductor chips by way of a through-hole conductor extending through the insulating material overlying said bare semiconductor chips.

* * * * *